(12) United States Patent
Raghavan (10) Patent No.: US 7,821,859 B1
(45) Date of Patent: Oct. 26, 2010

(54) ADAPTIVE CURRENT SENSE AMPLIFIER WITH DIRECT ARRAY ACCESS CAPABILITY

(75) Inventor: Vijay Kumar Srinivasa Raghavan, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 153 days.

(21) Appl. No.: 11/973,696

(22) Filed: Oct. 9, 2007

Related U.S. Application Data (60) Provisional application No. 60/854,599, filed on Oct. 24, 2006.

(51) Int. Cl.
*G11C 7/02* (2006.01)

(52) U.S. Cl. .................. 365/208; 365/207; 365/205; 327/51; 327/52

(58) Field of Classification Search ............... 365/208, 365/207, 205, 203; 327/51, 52
See application file for complete search history.

(56) References Cited

U.S. PATENT DOCUMENTS

| | | | |
|---|---|---|---|
| 3,636,530 A | 1/1972 | Mark et al. | |
| 3,676,717 A | 7/1972 | Lockwood | |
| 3,950,737 A | 4/1976 | Uchida et al. | |
| 4,044,343 A | 8/1977 | Uchida | |
| 4,128,773 A | 12/1978 | Troutman et al. | |
| 4,132,904 A | 1/1979 | Harari | |
| 4,271,487 A | 6/1981 | Craycraft et al. | |
| 4,342,101 A | 7/1982 | Edwards et al. | |
| 4,800,533 A | 1/1989 | Arakawa | |
| 4,878,203 A | 10/1989 | Arakawa | |
| 5,029,132 A | 7/1991 | Arakawa | |
| 5,065,362 A | 11/1991 | Herdt et al. | |
| 5,097,449 A | 3/1992 | Cuevas | |
| 5,168,334 A | 12/1992 | Mitchell et al. | |
| 5,189,641 A | 2/1993 | Arakawa | |
| 5,315,177 A | 5/1994 | Zagar et al. .................. 307/465 |
| 5,353,248 A | 10/1994 | Gupta | |
| 5,426,605 A | 6/1995 | Van Berkel et al. | |
| 5,436,480 A | 7/1995 | Yu | |
| 5,440,508 A | 8/1995 | Pathak et al. | |
| 5,488,579 A | 1/1996 | Sharma et al. | |
| 5,496,756 A | 3/1996 | Sharma et al. | |
| 5,602,776 A | 2/1997 | Herdt et al. | |

(Continued)

OTHER PUBLICATIONS

U.S. Appl. No. 11/415,694, filed May 1, 2006, Stansell et al.

(Continued)

*Primary Examiner*—Huan Hoang (57) ABSTRACT

A current sense amplifier can include an active load circuit having a first load device and second load device coupled in parallel to a first power supply node. A first load device and second load device can provide an impedance that varies according to a potential at a load control node. A reference current circuit can be coupled between the first load device and a second power supply node that includes a current reference section that provides an impedance according to a bias voltage. A data current circuit can be coupled between the second load device and a plurality of memory cells. An adaptive bias circuit can be coupled between the first power supply and the second power supply node and can include a bias section coupled to the load control node that provides an impedance according to the bias voltage.

20 Claims, 5 Drawing Sheets

U.S. PATENT DOCUMENTS

| | | | |
|---|---|---|---|
| 5,732,032 | A | 3/1998 | Park et al. |
| 5,734,617 | A | 3/1998 | Zheng |
| 5,812,477 | A | 9/1998 | Casper et al. ............ 365/225.7 |
| 5,864,499 | A | 1/1999 | Rohparvar et al. |
| 5,875,144 | A | 2/1999 | Zheng |
| 5,892,712 | A | 4/1999 | Hirose et al. |
| 5,956,269 | A | 9/1999 | Ouyang et al. |
| 5,978,298 | A | 11/1999 | Zheng |
| 5,986,932 | A | 11/1999 | Ratnakumar et al. |
| 5,999,447 | A | 12/1999 | Naura et al. |
| 6,011,742 | A | 1/2000 | Zheng |
| 6,016,264 | A | 1/2000 | Lin ............................ 365/96 |
| 6,084,814 | A | 7/2000 | Casper et al. ............ 365/225.7 |
| 6,097,618 | A | 8/2000 | Jenne |
| 6,122,191 | A | 9/2000 | Hirose et al. |
| 6,125,069 | A | 9/2000 | Aoki ....................... 365/225.7 |
| 6,141,247 | A | 10/2000 | Roohparvar et al. |
| 6,172,907 | B1 | 1/2001 | Jenne |
| 6,181,627 | B1 | 1/2001 | Casper et al. ............ 365/225.7 |
| 6,194,738 | B1 | 2/2001 | Debenham et al. |
| 6,246,623 | B1 | 6/2001 | Ingalls ..................... 365/225.7 |
| 6,285,586 | B1 | 9/2001 | Lung et al. |
| 6,297,103 | B1 | 10/2001 | Ahn et al. |
| 6,363,011 | B1 | 3/2002 | Hirose et al. |
| 6,373,771 | B1 | 4/2002 | Fifield et al. ............. 365/225.7 |
| 6,384,664 | B1 | 5/2002 | Hellums et al. ............ 327/525 |
| 6,420,925 | B1 | 7/2002 | Fifield et al. |
| 6,469,930 | B1 | 10/2002 | Murray .................. 365/185.08 |
| 6,490,203 | B1 | 12/2002 | Tang |
| 6,532,169 | B1 | 3/2003 | Mann et al. |
| 6,553,556 | B1 | 4/2003 | Blodgett |
| 6,556,487 | B1 | 4/2003 | Ratnakumar et al. |
| 6,574,145 | B2 | 6/2003 | Kleveland et al. |
| 6,608,498 | B2 | 8/2003 | Khoury ....................... 324/765 |
| 6,617,914 | B1 | 9/2003 | Kothandaraman |
| 6,621,324 | B2 | 9/2003 | Fifield et al. |
| 6,625,080 | B2 | 9/2003 | Casper et al. |
| 6,633,506 | B2 | 10/2003 | Casper et al. |
| 6,674,665 | B1 | 1/2004 | Mann et al. |
| 6,714,469 | B2 | 3/2004 | Rickes et al. |
| 6,741,117 | B2 | 5/2004 | Lee |
| 6,759,895 | B2 | 7/2004 | Takami |
| 6,781,916 | B2 | 8/2004 | McClure |
| 6,983,404 | B2 | 1/2006 | Cutter et al. ................. 714/721 |
| 7,031,189 | B2 | 4/2006 | Pascucci |
| 7,146,585 | B2 | 12/2006 | Blodgett |
| 7,149,114 | B2 | 12/2006 | Taheri et al. |
| 7,339,848 | B1 | 3/2008 | Stansell et al. |
| 7,342,424 | B2 * | 3/2008 | Kang et al. .................. 327/108 |
| 7,342,836 | B2 | 3/2008 | Taheri et al. |
| 7,426,142 | B1 | 9/2008 | Stansell et al. |
| 2002/0057597 | A1 * | 5/2002 | Fuchigami et al. ..... 365/185.21 |
| 2005/0213387 | A1 * | 9/2005 | Kubo et al. ............ 365/185.21 |

OTHER PUBLICATIONS

U.S. Appl. No. 11/726,525, filed Mar. 21, 2007, Stansell, Galen.
USPTO Miscellaneous Action for U.S. Appl. No. 11/343,341 dated Jan. 18, 2008; 2 pages.
USPTO Notice of Alllowance for U.S. Appl. No. 11/343,341 dated Sep. 10, 2007, 7 pages.
U.S. Appl. No. 11/343,341: "Anti-Fuse Latch Circuit and Method Including Self-Test," Stansell et al.; 51 pages.
USPTO Requirement for Restriction/Election for U.S. Appl. No. 11/701,650 dated Nov. 22, 2008; 6 pages.
U.S. Appl. No. 11/701,650: "Method for Validating the Programming Status of Nonvolatile Memory Elements," Stansell; 44 pages.
USPTO Notice of Allowance for U.S. Appl. No. 11/415,694 dated May 6, 2008; 4 pages.
USPTO Non-Final Rejection for U.S. Appl. No. 11/415,694 dated Nov. 1, 2007; 9 pages.
U.S. Appl. No. 11/415,694: "Device and Method for Sensing Programming Status of Non-Volatile Memory Elements," Stansell et al.; 37 pages.
U.S. Appl. No. 09/892,164: "SONOS Latch and Application," Mann et al.; 26 pages, filed on Jun. 26, 2001.
U.S. Appl. No. 10/368,528: "SONOS Latch and Application," Mann et al.; 28 pages, filed on Feb. 18, 2003.
U.S. Appl. No. 11/726,525: "Anti-Fuse Latch Self-Test Circuit and Method," Stansel et al., filed on Mar. 21, 2007; 29 pages.
USPTO Notice of Allowance for U.S. Appl. No. 11/726,525 dated Apr. 21, 2009; 7 pages.
USPTO Non-Final Rejection for U.S. Appl. No. 11/726,525 dated Oct. 17, 2008: 5 pages.
USPTO Miscellaneous Action for U.S. Appl. No. 10/803,011 dated Mar. 18, 2005; 1 page.
USPTO Non-Final Rejection for U.S. Appl. No. 10/803,011 dated Dec. 9, 2005; 13 pages.
USPTO Final Rejection for U.S. Appl. No. 10/803,011 dated May 30, 2006; 13 pages.
U.S. Appl. No. 10/803,011: "Latched Circuit and Method for Writing and Reading Volthe and Non-Volatile Data to and from the Latch," Taheri et al., filed on Mar. 17, 2004; 31 pages.
USPTO Notice of Allowance for U.S. Appl. No. 10/803,011 dated Aug. 3, 2006; 7 pages.
USPTO Miscellaneous Action for U.S. Appl. No. 11/234,429 dated Feb. 14, 2006; 2 pages.
USPTO Non-Final Rejection for U.S. Appl. No. 11/234,429 dated Jun. 18, 2007; 7 pages.
USPTO Notice of Allowance for U.S. Appl. No. 11/234,429 dated Oct. 18, 2007: 5 pages.
U.S. Appl. No. 11/234,429: "One Time Programmable Latch and Method," Taheri et al., filed on Sep. 23, 2005: 48 pages.
International Search Report of the International Searching Authority for International Application No. PCT/US2005/008154 mailed Jul. 1, 2005; 2 pages.
Written Opinion of the International Searching Authority for International Application No. PCT/US2005/008154 received Jun. 29, 2005; 5 pages.
USPTO Notice of Allowance for U.S. Appl. No. 09/703,151 dated Jun. 4, 2002; 5 pages.
USPTO Non-Final Rejection for U.S. Appl. No. 09/703,151 dated Jan. 16, 2002; 5 pages.
USPTO Notice of Allowance for U.S. Appl. No. 07/361,033 dated Apr. 30, 1991; 3 pages.
USPTO Final Refection for U.S. Appl. No. 07/361,033 dated Jan. 18, 1991; 5 pages.
USPTO Non-Final Rejection for U.S. Appl. No. 07/361,033 dated Jun. 12, 1990; 11 pages.
USPTO Notice of Allowance for U.S. Appl. No. 08/549,483 dated Jun. 8, 1996; 3 pages.
USPTO Non-Final Rejection for U.S. Appl. No. 08/549,483 dated May 29, 1996; 5 pages.
USPTO Notice of Allowance for U.S. Appl. No. 08/846,558 dated Jul. 20, 1998; 3 pages.
USPTO Requirement Restriction for U.S. Appl. No. 09/136,694 dated Aug. 17, 1999; 4 pages.
Frohman-Bentchkowsky, "The Methal-Nitrice-Oxide-Silicon (MNOS) Transistor—Characteristics and Applications," Proceedings of the IEEE, vol. 58, No. 8, Aug. 1970, pp. 1207-1219; 13 pages.
Donaldson et al., "SNOS 1K X 8 Static Nonvolatile RAM," IEEE Journal of Solid-State Circuits, vol. SC-17, No. 5, Oct. 1982, pp. 847-851; 5 pages.
Hirose et al., "Non-Volatile Latch for FPGA Devices," NVX Corporation, Jan. 10, 1995; 6 pages.
Hirose et al., "Non-Volatile Latch Description," NVX Corporation, Nov. 1, 1995; 23 pages.
Hirose et al., "Non-Volatile Latch for Semiconductor Devices," NVX Corporation, Sep. 8, 1994; 13 pages.
USPTO Notice of Allowance for U.S. Appl. No. 09/136,694 dated Apr. 24, 2000; 4 pages.
USPTO Non-Final Rejection for U.S. Appl. No. 09/136,694 dated Nov. 12, 1999; 8 pages.

USPTO Notice of Allowance for U.S. Appl. No. 09/626,267 dated Aug. 7, 2001; 5 pages.
USPTO Non-Final Rejection for U.S. Appl. No. 09/626,267 dated Mar. 28, 2001; 5 pages.

USPTO Requirement for Restriction/Election for U.S. Appl. No. 09/626,267 dated Dec. 1, 2000; 4 pages.

* cited by examiner

ADAPTIVE CURRENT SENSE AMPLIFIER WITH DIRECT ARRAY ACCESS CAPABILITY

This application claims the benefit of U.S. Provisional Patent Application Ser. No. 60/854,599 filed on Oct. 24, 2006, the contents of which are incorporated by reference herein.

TECHNICAL FIELD

The present invention relates generally to sense amplifier circuits, and more particularly to current sense amplifier circuits that can be included in memory devices.

BACKGROUND OF THE INVENTION

Figure 7:
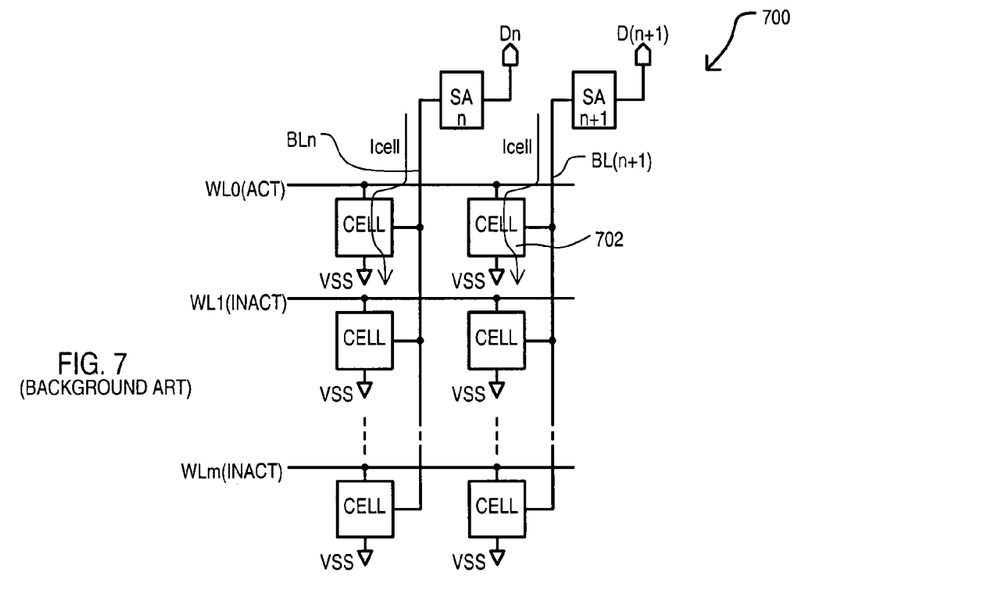
FIG. 7 is a block schematic diagram showing a memory device having single ended current sensing.

Memory devices, such as nonvolatile memory devices, can use single ended current sensing schemes. One example of a single ended current sensing scheme is shown in FIG. 7 and designated by the general reference character 700. A single ended current sensing arrangement 700 can include a number of memory cells (e.g., 702) each connected to a bit line (BLn, BL(n+1)) and a word line (WL0 to WLm). When a memory cell (e.g., 702) is selected, it can create a current path to draw a current Icell. A memory cell current (Icell) can vary according to a data value stored. Sense amplifiers (SAn, SA(n+1)) can be connected to groups of cells, such as columns or groups of columns. Each sense amplifier (SAn, SA(n+1)) can compare a cell current (Icell) to a reference value to determine the value of the data stored in the selected cell (e.g., 0 or 1). For example, for some technologies, a programmed memory cell can draw less current than an erased (or nonprogrammed memory cell).

To provide current sensing memory devices with fast access speeds, it is desirable for a current sense amplifier to amplify sensed current differences into an output voltage in as short a period of time as possible.

To better understand various aspects of the disclosed embodiments, a conventional current sense amplifier will now be described with reference to FIG. 6.

Figure 6:
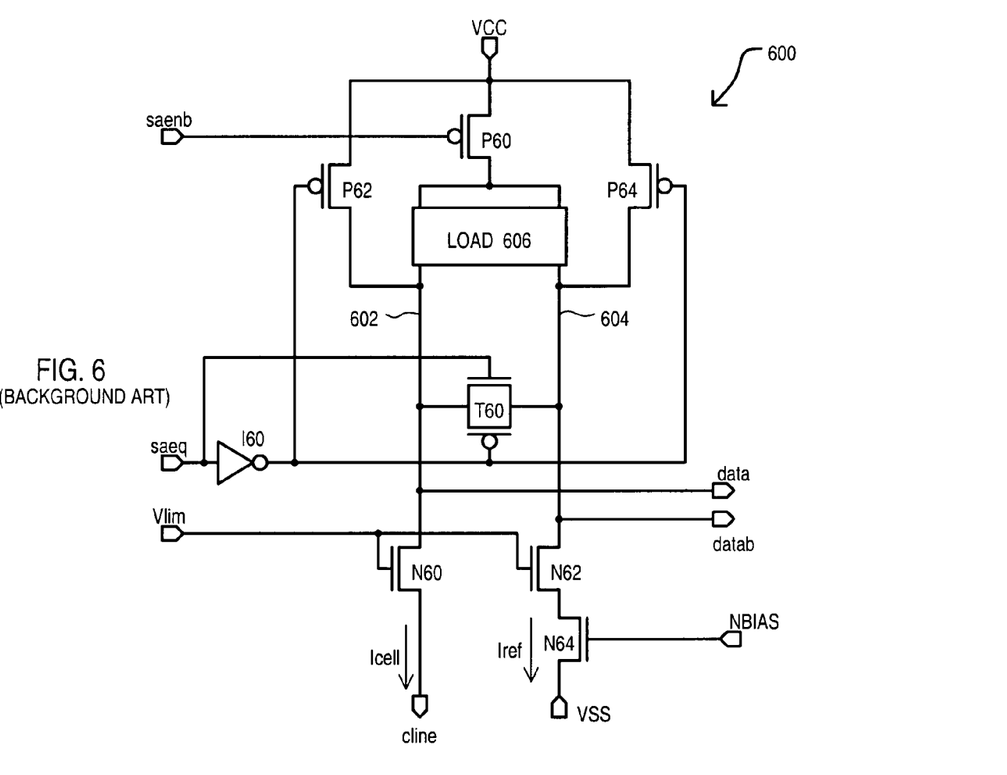
FIG. 6 is a block schematic diagram of a conventional current sense amplifier.

FIG. 6 shows a conventional sense amplifier (SA) 600 that has a precharge (equalization) mode of operation and a sense mode of operation.

In a precharge mode, equalization signal saeq can be active (in this case high), while a sense enable signal saenb can be inactive (in this case high). With signal saenb high, an enable p-channel metal-oxide semiconductor (PMOS) transistor P60 can be turned off. With signal saeq high, precharge PMOS transistors P62 and P64 can be turned on, pulling first data node 602 and second data node 604 to a high power supply voltage VCC. In alternate conventional arrangements, diode connected p-channel devices can be included in such precharge paths, and first data and second data nodes (602 and 604) can be precharged to VCC−Vtp, where Vtp is a threshold voltage of such diode connected transistors. In addition, signal saeq can turn on complementary MOS (CMOS) passgate T60, to ensure first and second data nodes (602 and 604) are at same precharge potential (i.e., equalized).

In a sense mode, equalization signal saeq can be inactive (in this case low), while a sense enable signal saenb can be active (in this case low). With signal saeq low, precharge transistors (P62 and P64), and passgate T60 can be off, isolating first and second data nodes (602 and 604) from one another. At the same time, with signal saenb low, enable transistor P60 can be turned on, coupling a load circuit 606 to a high power supply voltage VCC. Load circuit 606 can complete a path for a current Icell between a selected memory cell and VCC, as well as a path for current Iref between a low power supply VSS and VCC.

In some conventional arrangements, a load circuit 606 can include a first resistor between a first data node 602 and PMOS device 60, and a second resistor between a second data node 604 and PMOS device 60. In an alternate conventional arrangement, a load device can include two transistors connected in a current mirror configuration.

As shown in FIG. 6, the generation of a reference current Iref can be established by a bias voltage NBIAS applied to the gate of transistor N64. Ideally, a reference current Iref can be set to have a value between a current drawn by an erased memory cell, and that drawn by a programmed memory cell.

In a sense operation, at the same time a current Iref is being drawn through second data node 604, a current Icell can be drawn through first data node 602 in response to a selected memory cell. If Icell>Iref, then first data node 602 can be pulled to a lower potential than second data node 604, creating a differential voltage representing one type of stored data value. Conversely, if Icell<Iref, then second data node 604 can be pulled to a lower voltage than first data node 602. Such a difference in potential at first and second data nodes (602 and 604) can be further amplified by one or more downstream voltage amplifiers to generate an output read data value.

Conventional SA 600 can also include current/voltage limit NMOS devices N60 and N62 which can limit a maximum value for currents Icell and Iref; or limit a maximum value for voltage on the memory cell bitline. In particular, a limit voltage Vlim can be applied to the gates of such devices.

A drawback to an arrangement like that of FIG. 6 can be that the use of resistors within a load circuit 606, whether implemented as polycrystalline (polysilicon) resistors or substrate diffusion regions, can require considerable substrate area in the event currents Icell and Iref are small.

In addition, if data nodes (602 and 604) are pre-charged to VCC, such data nodes can take substantial amounts of time to reach a final value suitable for sensing because the common mode of the output differential voltage is usually set close to VCC/2 for the subsequent amplifier stages to amplify quickly.

At the same time, precharging data nodes (602 and 604) to a value VCC−Vtp using diode connected PMOS devices can be impractical at low voltage applications as such a Vtp drop from VCC can create "headroom" issues for the sense amplifier and for the memory cell. That is, the working range of voltages for sensing operations can be undesirable small.

Yet another problem that can arise from a conventional approach like that of FIG. 6 can be that some nonvolatile memory technologies have cell current values that can change with temperature and/or due to aging of the memory cells. To accommodate such changes, a reference current should move correspondingly. However, when a reference current Iref moves up or down significantly (around +/−50%), then a common mode operating point of the output differential can move significantly, as a load circuit 606 can continue to provide a same load value.

DETAILED DESCRIPTION

Various embodiments of the present invention will now be described with reference to a number of figures. The embodiments show current sense amplifiers that can adapt to varying reference currents, provide faster sensing than conventional approaches, and/or provide a direct array access capability to measure cell currents directly Referring now to FIG. 1, a sense amplifier (SA) circuit according to a first embodiment is shown in a block schematic diagram and designated by the general reference character 100. A SA circuit 100 can include an enable section 102, a load circuit 104, a data current leg 106, a reference current leg 108, and a precharge circuit 110.

Figure 1:
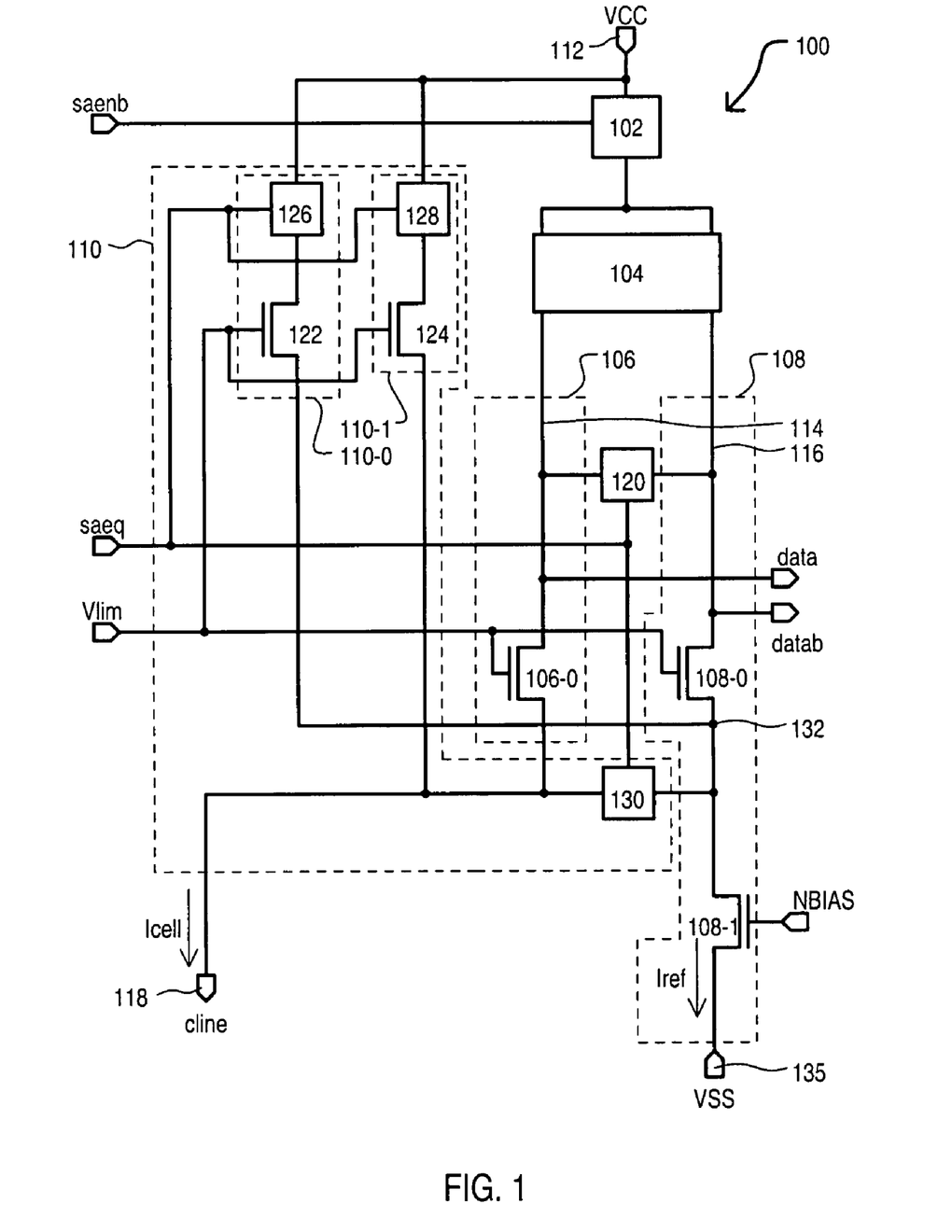
FIG. 1 is a block schematic diagram of a current sense amplifier according to a first embodiment.

An enable section 102 can be controlled by a sense amplifier enable signal saenb. In a precharge mode, enable section 102 can be disabled and provide a high impedance path. In sense mode, enable section 102 can be enabled, coupling load circuit 104 to high power supply node 112. A load circuit 104 can provide essentially the same impedance to both a data current leg 106 and a reference current leg 108.

A data value can be sensed according to a differential voltage generated between first data node 114 of data current leg 106, and a second data node 116 of reference current leg 108. Such a differential voltage can be generated according to a difference between a data current (Icell) drawn by data current leg 106, and a reference current (Iref) drawn by reference current leg 108.

A data current leg 106 can include a data current/voltage limit section 106-0, and can be connected to data current source at a data source node 118. As but one example, a data source node 118 can be connected to one or more bit lines by select circuits, where each such bit line can be connected to a number of memory cells. A data current limit section 106-0 can limit the current drawn by a data current leg 106 or limit the maximum voltage on the bit lines for reliability reasons. In the particular example shown, a data current/voltage limit section 106-0 includes a n-channel insulated gate field effect transistor (IGFET) having a drain connected to load circuit 104, a source connected to data source node 118, and a gate connected to receive a limit voltage Vlim. Preferably, such an n-channel IGFET can be a "native depletion" mode device (devices with a threshold voltage of about "0") to avoid supply headroom issues.

A reference current leg 108 can include a reference current/voltage limit section 108-0, and a reference current generator section 108-1. A reference current limit section 108-0 can operate the same fashion and have the same general construction as data current limit section 106-0. A reference current generator section 108-1 can ensure that a current drawn by a reference current leg 108, in a sense operation, is a reference current Iref. It is understood that a reference current (Iref) can be less than a maximum current allowed by reference current limit section 108-0. More particularly, a reference current is distinguishable between at least two different possible data currents (Icell). Even more particularly, a data current can vary between about a first value (Icell_prog) and a second value (Icell_erase), and a reference current can be selected to be about midway between these two memory cell current values. In the particular example shown, a reference current generator section 108-1 can include an n-channel transistor with a gate coupled to a bias voltage NBIAS.

Preferably, data current limit sections 106-0 and 108-0 can limit a current flow to no more than a maximum expected data current (Icell) value and/or limit a voltage on the bit line to no more than a maximum allowed value.

A precharge circuit 110 can include a first precharge path 110-0 and a second precharge path 110-1. A first precharge path 110-0 can be connected to between a high power supply node 112 and a bias node 132, and can include a first enable circuit 126 and a first limit section 122. Second precharge path 110-1 can be connected between high power supply node 112 and a data source node 118, and can include a second enable circuit 128 and a second limit section 124. Enable circuits (126 and 128) can provide a low impedance or very high impedance path according to a signal saeq. First and second limit circuits (122 and 124) can limit a potential at nodes 118 and 132 according to limit voltage Vlim. This is again done to limit the maximum voltage that can be applied on the bit lines for better memory cell reliability during the equalization phase.

In the particular example shown, each limit circuit (122 and 124) can include an n-IGFET having a source-drain path connected to a bias node 132 and a data source node 118, respectively, and gates commonly connected to receive a limit voltage Vlim. Even more particularly, such n-channel IGFETs can be native depletion mode devices.

A SA circuit 100 can further include a first equalization circuit 120 and a second equalization circuit 130. First equalization circuit 120 can be controlled by an equalization signal saeq and can provide a low or high impedance path between first and second data nodes (114 and 116). Second equalization circuit 130 can be connected between data source node 118 and a bias node 132 formed between current limit section 108-0 and a reference current generator section 108-1. Second equalization circuit 130 can also be controlled by an equalization signal saeq and provide a low or high impedance path based on such a signal.

Having described the construction of SA circuit 100, the operation of the circuit will now be described. A SA circuit 100 can include an equalization operation and sense operation.

In an equalization (or precharge) phase, signal saeq can be driven high (e.g., VCC) and signal saenb can also be driven high (e.g., VCC). As a result, by operation of limit circuits (122 and 124) and equalization circuit 130, data source node 118 and bias node 132 can be precharged to a potential of about Vlim. Further, by operation of data limit current section 106-0, reference current limit section 108-0, and equalization circuit 120, first and second data nodes (114 and 116) can also be precharged to a potential of about Vlim.

As noted above, a voltage Vlim can be set to limit the voltage value on nodes 118 and 132 from exceeding a certain maximum value. Doing so can provide for increased memory cell reliability. Such a voltage can also provide a means to apply the maximum allowable voltage on the bitlines for generating a maximum possible erase current, and thus helps to ensure a best sense margin and read speed.

The above-described precharge operation is in contrast to a conventional approach that can precharge data nodes to a high power supply voltage (VCC) or a high power supply voltage less a threshold voltage (VCC−Vtp).

In a sense operation, signal saeq and signal saenb can be driven to a low potential (e.g., Vss). Such an operation can disable any current paths through precharge circuit 110, and enable current paths through data current leg 106 and reference current leg 108 by way of load circuit 104 and enable circuit 102.

In a read access of a memory cell, a current through data current leg 106 can vary according to memory cell state, as compared to a current through reference current leg. For example, during a read access of an erased cell, Icell>Iref, and first data node 114 can go lower than second data node 116. In contrast, during a read access of a programmed cell, Icell<Iref, and second data node 116 can go lower than first data node 114. However, because a previous equalization voltage has precharged nodes 114, 116, 118 and 132 close to a voltage that generates maximum expected erase current, a sense operation can start at levels corresponding to a highest erase cell current (Icell) possible, and a differential voltage can develop between nodes 114 and 116 (the nodes can "split") at a faster rate than a conventional approach.

The above and below described embodiments may be particularly applicable to memory devices containing silicon-oxide-nitride-oxide-silicon (SONOS) type memory cells. However, the present invention could be utilized in other current based memory technologies, including but not limited to floating gate based memory cells, metal-nitride-oxide-silicon (MNOS) type memory cells, and/or dual gate memory cells, as but a few examples.

Figure 2:
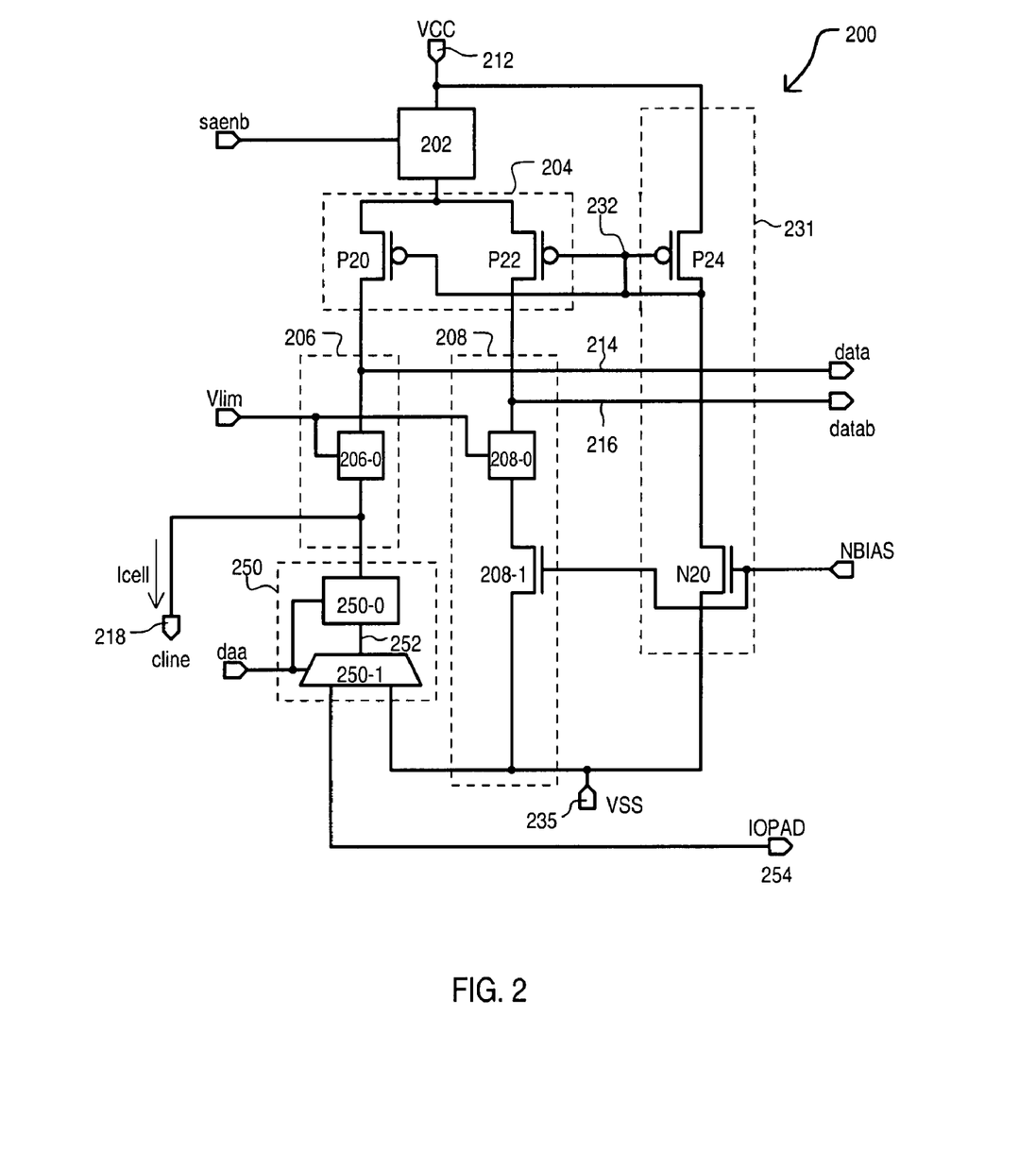
FIG. 2 is a block schematic diagram of a current sense amplifier according to a second embodiment.

Referring now to FIG. 2, a sense amplifier circuit according to a second embodiment is shown in a block schematic diagram and designated by the general reference character 200. A sense amplifier circuit 200 can include some of the same general sections as FIG. 1, accordingly, like sections are referred to by the same reference character but with the first digit being a "2" instead of a "1".

Unlike the embodiment of FIG. 1, sense amplifier circuit 200 shows an adaptive bias circuit 231 and direct access circuit 250. In the arrangement of FIG. 2, a load circuit 204 can be an active load circuit controlled according to a potential at a load control node 232. In the particular example shown, load circuit 204 can include first load transistor P20 coupled between enable circuit 202 and data current path 206, and a second load transistor P22 coupled between enable circuit 202 and reference current path 208. Transistors P20 and P22 can have gates commonly connected to load control node 232.

An adaptive bias circuit 204 can include an adaptive load device P24 and an adaptive bias device N20. An adaptive bias device N20 can follow the operation of reference current generator section 208-1 within reference current leg 208, providing an impedance that can vary according to a bias voltage NBIAS. Adaptive load device P24 can provide a bias point that will track any changes in the impedance of bias device N20. In the example of FIG. 2, adaptive load device P24 can include a p-channel IGFET having a gate and drain connected to load control node 232. In this way, load circuit 204 can be controlled in a current mirror fashion by adaptive load device P24.

As noted above, a program/erase current window (nominal values needed to program and erase a nonvolatile memory cell) can change significantly across temperature and/or due to aging of the memory cells. As a result, a circuit that generates bias voltage NBIAS (and hence Iref) can be designed to track such changes in a program/erase current window. Thus, in the arrangement of FIG. 2, based on bias voltage NBIAS, a bias voltage to load devices P20 and P22 can change such that a common mode operating point for first and second outputs 214 and 216 does not get too close to power supply voltage levels (e.g., VCC or VSS), as can be the case for a conventional approach like that of FIG. 6. As a result, downstream voltage amplifiers can amplify a developed differential voltage without the need for level shifting stages.

It is noted that for many nonvolatile memory devices, such as those based on SONOS memory cells, it may be desirable to directly sense a current drawn by such memory cells via an external connection to the memory device, such as an input/output (I/O) pad. A conventional approach, like that of FIG. 6, does not include such capabilities.

However, the embodiment of FIG. 2 includes a direct access circuit 250 that can enable direct access of memory cells for external testing and/or characterization.

Referring again to FIG. 2, a direct access circuit 250 can include an internal node 252 situated between an isolation circuit 250-0 and a MUX 250-1. When a direct access signal daa is inactive, isolation circuit 250-0 can isolate data source node 218 from internal node 252. At the same time, MUX 250-1 can connect internal node 252 to a low power supply node 235. However, when a direct access signal daa is active, isolation circuit 250-0 can connect data source node 218 to internal node 252, and MUX 250-1 can connect internal node 252 to an I/O pad 254. In this way, a direct path can be created between data source node 218 (which can be connected to the memory cells), and I/O pad 254.

In this way, in a direct access mode, memory cells can be directly accessed via an I/O pad. However, in a standard mode of operation, the internal node 252 can be connected to a low power supply node. This can provide for greater noise immunity of data source node 218 from noise at the I/O pad 254.

Figure 3:
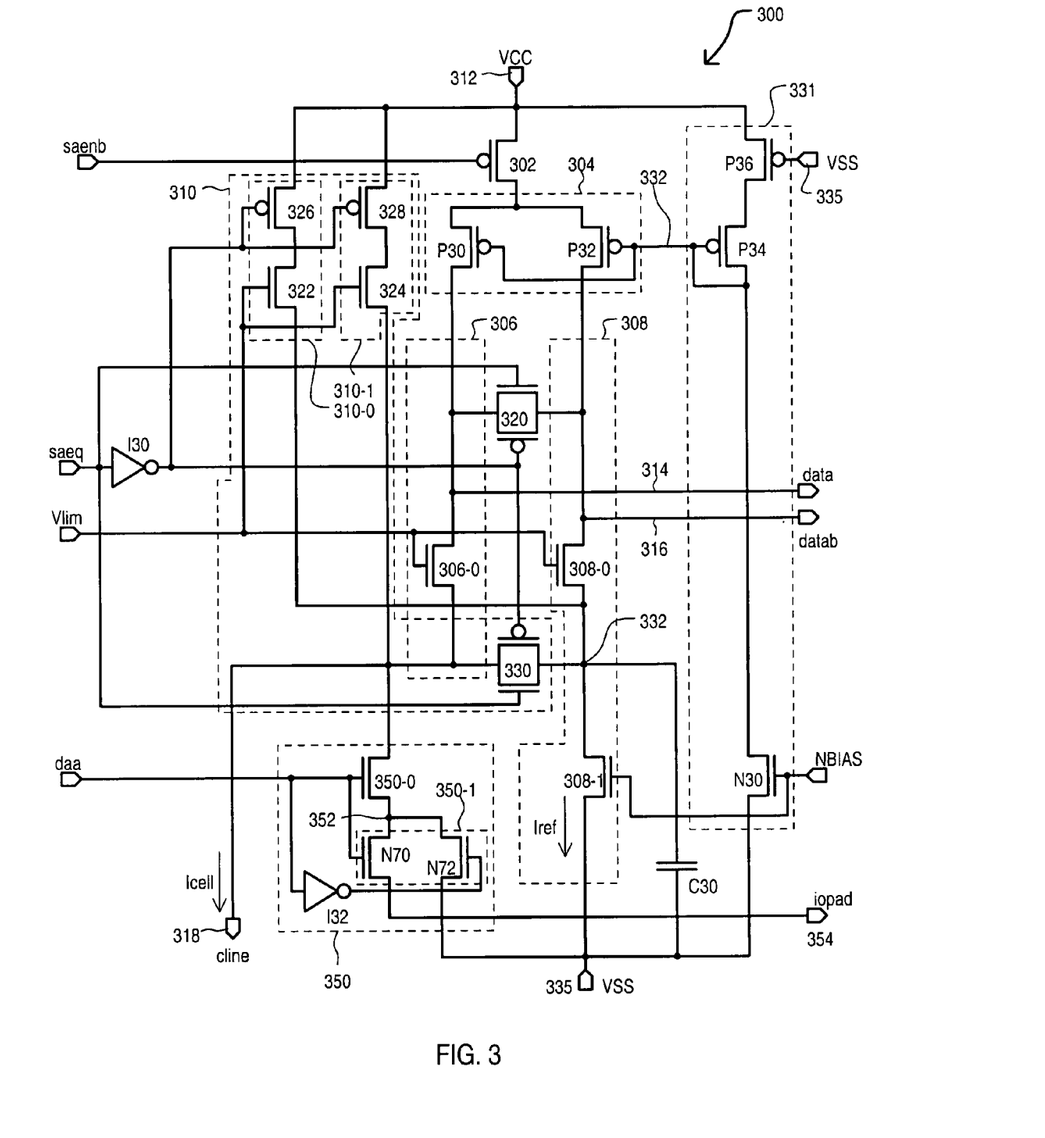
FIG. 3 is a block schematic diagram of a current sense amplifier according to a third embodiment.

Referring now to FIG. 3, a sense amplifier circuit 300 according to a third embodiment is shown in a block schematic diagram. A sense amplifier 300 can include some of the same general sections as FIGS. 1 and 2, accordingly, like sections are referred to by the same reference character but with the first digit being a "3" instead of a or "2".

Unlike the previous embodiments, sense amplifier 300 shows an arrangement in which an enable circuit 302 can include a p-channel IGFET having a source-drain path connected between a high power supply node 312 and a load circuit 304. Similarly, enable circuits (326 and 328) within precharge circuit 310 can be p-channel IGFETs, with gates coupled to receive the inverse of the equalization signal saeq via an inverter 130.

Equalization circuits 320 and 330 for sense amplifier 300 can be formed with complementary transistors in a CMOS passgate type configuration. Accordingly, p-channel devices within such passgates can receive the inverse of signal saeq via an inverter 130, while n-channel devices within such passgates can receive signal saeq.

Referring still to FIG. 3, an adaptive bias circuit 331 can include a supply device P36 connected between a high power supply node 312 and adaptive load device P34. In the example shown, device P36 can be a p-channel IGFET with a gate connected to a low power supply node 335. Transistor P36 can be included to provide a voltage drop that mimics that provided by the transistor of enable circuit 302.

In the particular example of FIG. 3, an isolation circuit 350-0 can be an n-channel IGFET with a source-drain path connected between data source node 318 and internal node 352, and a gate that receives a direct access signal daa. A MUX 350-1 can include a first MUX n-channel IGFET N70 having a source-drain path connected between internal node 352 and I/O pad 354, and a second MUX n-channel IGFET N72 having a source-drain path connected between internal node 352 and a low power supply node 335. Transistor N70 can receive signal daa at its gate, while transistor N72 can receive the inverse of signal daa at its gate via an inverter 132.

FIG. 3 also shows a capacitor C30 connected between a bias node 332 and a low power supply node 335. Capacitor C30 can be included to match a capacitance on a reference current leg 308 to that of a data current leg 306 (which can include a bit line and corresponding memory cell capacitances). This can ensure that both a reference current leg 308 and data current leg 306 can operate with similar time constants and thus enable better sense margin and read speed.

Figure 4:
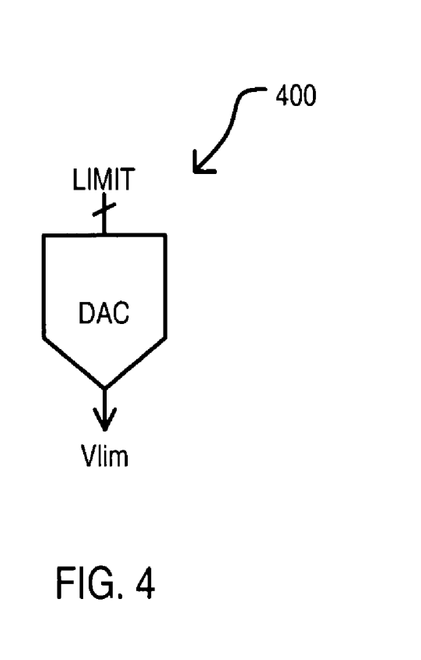
FIG. 4 is a block schematic diagram of a limit voltage generator that can be used in the embodiments.

FIG. 4 shows one example of a limit voltage generator 400 according to an embodiment. As shown, a limit voltage Vlim can be generated with a digital-to-analog converter (DAC). This can allow for accurate setting of a limit voltage, as well as enabling such a value to be programmable, and hence changed in response to temperature and/or aging.

Figure 5:
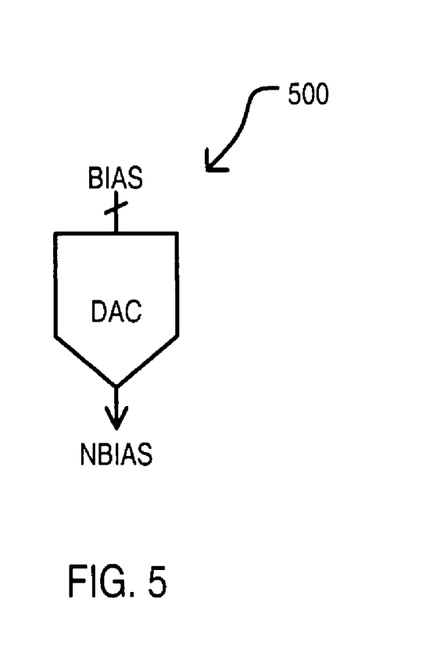
FIG. 5 is a block schematic diagram of a reference voltage generator that can be used in the embodiments.

Similarly, FIG. 5 shows one example of a bias voltage generator 500 according to an embodiment. A bias voltage NBIAS can also be generated with a DAC, and hence to accurately set and/or programmable to meet changing conditions.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A current sense amplifier circuit, comprising:
a reference current leg that includes a reference limit section coupled between a first data node and a bias current node;
a data current leg that includes a data limit section coupled between a second data node and a sense current node; and
an equalization circuit that includes
a first equalization path coupled between the first data node the second data node, and a second equalization path coupled between the bias current node and the sense current node, the first and second equalization paths providing a high or low impedance in response to an equalization signal, and
a first limit section coupled between a first power supply node and the bias current node, and a second limit section coupled between the first power supply node and the data current node; wherein
a current flowing through the reference limit section, data limit section, first limit section and second limit section is limited according to a limit voltage.

2. The current sense amplifier of claim 1, wherein:
the reference limit section, the data limit section, first limit section, and second limit section each comprise a voltage limit transistor having a gate coupled to receive the limit voltage.

3. The current sense amplifier of claim 2, wherein:
each voltage limit transistor comprises an n-channel insulated gate field effect transistor.

4. The current sense amplifier of claim 1, wherein:
the data current node is coupled to a plurality of nonvolatile memory cells; and
the limit voltage prevents a voltage on the bias current node and the sense current node from exceeding a maximum allowable voltage for the memory cells.

5. The current sense amplifier of claim 1, further including:
a load circuit that provides essentially a same impedance between the first power supply node and the reference current leg and data current leg.

6. The current sense amplifier of claim 5, wherein:
the load circuit includes a first load transistor coupled between the first power supply node and the first data node, and
a second load transistor coupled between the first power supply node and the second data node having a gate coupled to the gate of the first load transistor.

7. The current sense amplifier of claim 5, wherein:
the reference current leg further includes a reference current generator section that limits a current flowing through the reference current leg to a reference current in response to a bias voltage, the reference current being below the current limit established by the reference limit section;
an adaptive bias current leg that having a bias current section that limits a current flowing through the adaptive bias leg to a bias current in response to the bias voltage; and
the load circuit is coupled to the adaptive bias circuit and the same impedance varies in response to the bias current.

8. The current sense amplifier of claim 7, wherein:
the load circuit comprises
a first load transistor of a first conductivity type coupled between the first power supply node and the first data node, and
a second load transistor of the first conductivity type coupled between the first power supply node and the second data node; and
the reference current generator section comprises a reference transistor of a second conductivity type;
the adaptive bias current leg includes an adaptive load transistor of the first conductivity type having a gate coupled to its drain and the bias current section comprises a bias transistor of the second conductivity type; wherein
the reference transistor and adaptive load transistors have gates commonly connected to the bias voltage and first load transistor, second load transistor, and adaptive load transistor have commonly connected gates.

9. The current sense amplifier of claim 1, wherein:
the equalization circuit further includes
a first equalization enable device coupled between the first power supply node and the first limit section,
a second equalization enable device coupled between the first power supply node and the second limit section, and
the first and second equalization devices providing high or low impedance paths in response to the equalization signal.

10. The current sense amplifier of claim 1, further including:
a multiplexer (MUX) circuit that selectively couples the data current node between a plurality of memory cells and an input/output node for an integrated circuit containing the current sense amplifier in response to a direct access signal.

11. The current sense amplifier of claim 10, wherein:
the MUX circuit includes an internal node, that is coupled to a second power supply node when the direct access signal has one value, and is coupled to the data current node when the direct access signal has a second value.

12. A current sense amplifier, comprising:
an active load circuit that includes a first load device and second load device coupled in parallel to a first power supply node, the first load device and second load device providing an impedance that varies according to a potential at a load control node;

a reference current circuit coupled between the first load device and a second power supply node that includes a current reference section that provides an impedance according to a bias voltage;

a data current circuit coupled between the second load device and a plurality of memory cells; and an adaptive bias circuit coupled between the first power supply and the second power supply node that includes a bias section coupled to the load control node that provides an impedance according to the bias voltage.

13. The current sense amplifier of claim 12, wherein:

the first load device and second load device comprise transistors having commonly connected gates;

the current reference section includes a reference transistor having a gate coupled to a reference voltage;

the adaptive bias circuit includes a bias load transistor coupled to the first power supply node and including a gate coupled to its drain and to the gates of the transistors of the first and second load device, and the bias section comprises a bias transistor coupled in series with the bias load transistor having a gate coupled to the reference voltage.

14. The current sense amplifier of 12, further including:

a reference digital to analog converter having an input coupled to receive a reference digital value and an output coupled to provide the reference voltage.

15. The current sense amplifier of claim 12, further including:

the reference current circuit further includes a reference limit section coupled to a first data node that provides an impedance that varies according to a limit voltage;

the data current circuit includes a data limit section coupled to a second data node that provides an impedance that varies according to the limit voltage; and a precharge circuit that includes a first precharge section coupled between the first power supply node and the first data node that provides an impedance according to the limit voltage, and a second precharge section coupled between the first power supply node and the second data node that provides an impedance according to the limit voltage.

16. The current sense amplifier of claim 15, further including:

a limit digital to analog converter having an input coupled to receive a limit digital value and an output coupled to provide the limit voltage.

17. The current sense amplifier of claim 12, further including:

a direct access section that includes a first controllable impedance path coupled between the data current circuit and an internal node, a second controllable impedance path coupled between the internal node and an external node, and a third controllable impedance path coupled between the internal node and a second power supply node.

18. A method of sensing a data value by comparing a sensed current to a reference current, comprising the steps of:

in a sense mode, limiting a voltage on the data current node to no more than a maximum voltage limit based on a limit voltage, limiting a current flow through a reference current leg and a data current leg to no more than a maximum current limit based on a limit voltage, controlling the current flowing through the reference current leg to value less than the maximum current limit according to a reference voltage, and varying an impedance of a load circuit coupled to the reference current leg and data current leg according to variations in the current flowing through the reference current leg; and in a precharge mode, precharging the reference current leg and the data current leg to a potential less than a high power supply level in response to the limit voltage.

19. The method of claim 18, further including:

limiting the voltage on the data current node and the reference current node includes applying the limit voltage to gates of transistors in both the reference current leg and data current leg, limiting the current flow through the reference current leg and data current leg includes applying the limit voltage to gates of transistors in both the reference current leg and data current leg; and precharging the reference current leg and the data current leg includes applying the limit voltage to gates of transistors in both a first precharge leg and a second precharge leg, the first precharge leg being coupled to the reference current leg, the second precharge leg being coupled to the data current leg.

20. The method of claim 18, further including:

in a direct access mode, coupling the data current leg to a external input of a semiconductor device by way of an internal node, and in a standard mode, isolating the data current leg from the external input and coupling the internal node to a power supply node.

* * * * *